United States Patent
Chen

(10) Patent No.: US 11,569,365 B2
(45) Date of Patent: Jan. 31, 2023

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventor: Chien-Hao Chen, Ilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 15 days.

(21) Appl. No.: 17/184,272

(22) Filed: Feb. 24, 2021

(65) Prior Publication Data

US 2022/0271140 A1  Aug. 25, 2022

(51) Int. Cl.
*H01L 29/49* (2006.01)
*H01L 29/40* (2006.01)
*H01L 27/088* (2006.01)

(52) U.S. Cl.
CPC ...... *H01L 29/4966* (2013.01); *H01L 27/0886* (2013.01); *H01L 29/401* (2013.01)

(58) Field of Classification Search
CPC ............... H01L 29/4966; H01L 29/401; H01L 27/0886
See application file for complete search history.

(56) References Cited

U.S. PATENT DOCUMENTS

| 9,425,279 B1* | 8/2016 | Ando | H01L 29/4966 |
| 2006/0267095 A1* | 11/2006 | Fujiwara | H01L 21/823842 257/347 |
| 2020/0144271 A1* | 5/2020 | Kim | H01L 27/10826 |

* cited by examiner

*Primary Examiner* — Christine A Enad
(74) *Attorney, Agent, or Firm* — WPAT; Anthony King

(57) ABSTRACT

A semiconductor device and a method for forming a semiconductor are provided. The semiconductor structure includes a gate structure. The gate structure includes a gate dielectric layer, a work function metal layer over the gate dielectric layer, and a plurality of barrier granules between the gate dielectric layer and the work function metal layer. At least two adjacent barrier granules of the plurality of barrier granules are separated from each other by a portion of the work function metal layer.

20 Claims, 12 Drawing Sheets

SEMICONDUCTOR STRUCTURE AND METHOD FOR MANUFACTURING THE SAME

BACKGROUND

The electronics industry has experienced an increasing demand for smaller and faster electronic devices that are able to support greater numbers of increasingly complex and sophisticated functions. Accordingly, there is a continuing trend in the semiconductor industry to manufacture low-cost, high-performance, low-power integrated circuits (ICs). Thus far, these goals have been achieved in large part by scaling down semiconductor IC dimensions (e.g., minimum feature size) and thereby improving production efficiency and reducing associated costs. However, such downscaling has also introduced increased complexity to the semiconductor manufacturing process. Thus, the realization of continued advances in semiconductor ICs and devices relies on advances in semiconductor manufacturing processes and technology.

As technology nodes achieve progressively smaller scales, in some IC designs, researchers have hoped to replace a typical polysilicon gate with a metal gate to improve device performance by decreasing feature sizes. One approach of forming the metal gate is called a "gate-last" approach, sometimes referred to as replacement polysilicon gate (RPG) approach. In the RPG approach, the metal gate is fabricated last, which allows for a reduced number of subsequent operations.

Further, as the dimensions of a transistor decrease, the thickness of the gate dielectric layer may be reduced to maintain performance with a decreased gate length. In order to reduce gate leakage, a high dielectric constant (high-k or HK) gate dielectric layer is used to provide a thickness as effective as that provided by a typical gate oxide used in larger technology nodes. A high-k metal gate (HKMG) approach including the metal gate electrode and the high-k gate dielectric layer is therefore recognized. However, the HKMG approach is a complicated approach, and many issues arise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
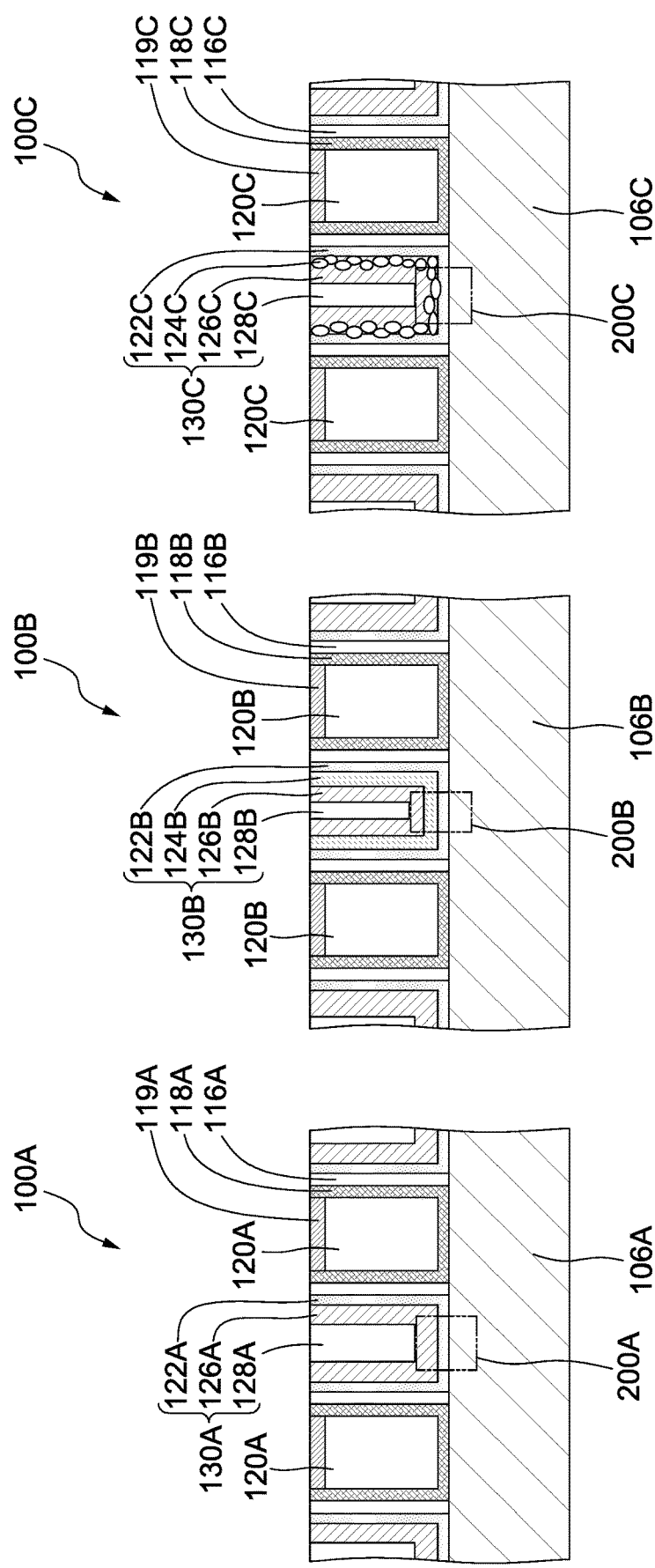
FIGS. 1A, 1B and 1C are schematic cross-sectional views of portions of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range (e.g., within 10%, 5%, 1%, or 0.5% of a given value or range) that can be contemplated by people having ordinary skill in the art. Alternatively, the term "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

With the ongoing down-scaling of integrated circuits, power supply voltages of the circuits may be reduced. However, the voltage reduction may be different in different circuits or regions. For example, threshold voltage (Vt) designs may be different between the memory circuits and the core circuits. A multiple-Vt capability is therefore applied for device design. As the gate length (Lg) scale is reduced in advanced nodes, to realize the multiple-Vt design using different gate metal materials becomes challenging due to the current Lg and available thin work function metal materials.

The present disclosure therefore provides a semiconductor structure and a method for forming a semiconductor structure in accordance with some embodiments. The semiconductor structure includes a gate structure including a barrier structure between a work function metal layer and a gate dielectric layer. The barrier structure has a metal barrier ability to shield the gate dielectric layer from metal diffusion originated from the work function metal layer, thereby being able to modulate Vt of a resultant semiconductor device such as a transistor. Consequently, the semiconductor structure with multiple Vt can be achieved. In some embodiments, the barrier structure is a grainy structure that includes a plurality of barrier granules. In some embodiments, the barrier structure including the plurality of barrier granules has a greater metal barrier ability than a continuous barrier layer. With the plurality of barrier granules, a great metal barrier ability can be achieved for Vt modulation even by an ultra-thin barrier structure (e.g., 0.1 nm to 5 nm). The ultra-thin barrier structure has less impact on gap filling in the gate structure and is suitable for use in a gate structure having a small gate length (Lg), thereby facilitating scaling in advanced technology nodes. Moreover, by using the barrier granules, a wide range of materials may be selected for the barrier structure.

Figure 2:
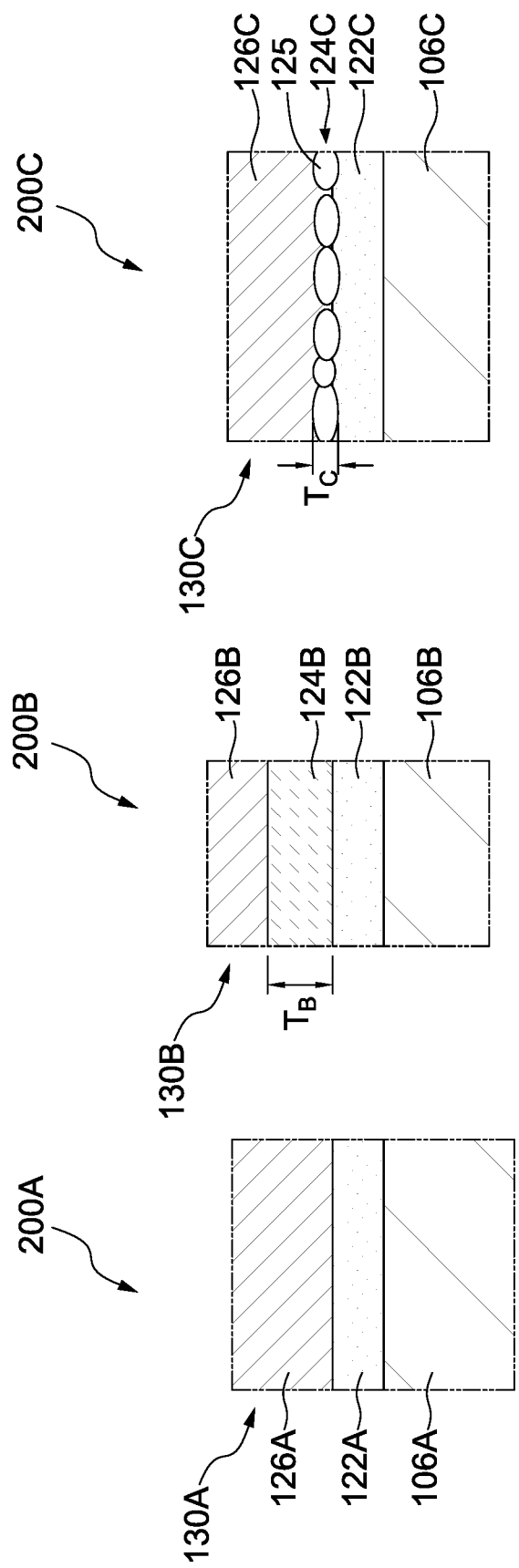
FIGS. 2A, 2B and 2C are magnified cross-sectional views of regions of the semiconductor structure illustrated in FIGS. 1A, 1B and 1C, respectively, in accordance with some embodiments of the present disclosure.

FIG. 1A is a schematic cross-sectional view of a portion 100A of a semiconductor structure in accordance with some embodiments of the present disclosure. FIG. 2A is a magnified cross-sectional view of a region 200A of the portion 100A of the semiconductor structure illustrated in FIG. 1A. Referring to FIG. 1A, the portion 100A of the semiconductor structure includes a gate structure 130A over a fin structure 106A. The gate structure 130A includes a gate dielectric layer 122A over the fin structure 106A, a work function metal layer 126A over the gate dielectric layer 122A, and a gap-filling metal layer 128A over the work function metal layer 126A. The portion 100A of the semiconductor structure may also include spacers 116A over sidewalls of the gate structure 130A, and the gate dielectric layer 122A may also be disposed adjacent to the spacers 116A. The portion 100A of the semiconductor structure further includes interlayer dielectric (ILD) structure 120A surrounding the gate structure 130A. In some embodiments, the portion 100A of the semiconductor structure further includes a contact etch stop layer (CESL) 118A between the ILD structure 120A and the spacers 116A and between the ILD structure 120A and the fin structure 106A. In some embodiments, a protective cap 119A is disposed on the ILD structure 120A.

FIG. 1B is a schematic cross-sectional view of a portion 100B of a semiconductor structure in accordance with some embodiments of the present disclosure. FIG. 2B is a magnified cross-sectional view of a region 200B of the portion 100B of the semiconductor structure illustrated in FIG. 1B. Referring to FIG. 1B, the portion 100B of the semiconductor structure includes a gate structure 130B over a fin structure 106B. The gate structure 130B includes a gate dielectric layer 122B over the fin structure 106B, a barrier layer 124B over the gate dielectric layer 122B, and a work function metal layer 126B over the barrier layer 124B, a gap-filling metal layer 128B over the work function metal layer 126B. The portion 100B of the semiconductor structure may also include spacers 116B over sidewalls of the gate structure 130B, and the gate dielectric layer 122B may also be disposed adjacent to the spacers 116B. The portion 100B of the semiconductor structure further includes an ILD structure 120B surrounding the gate structure 130B. In some embodiments, the portion 100B of the semiconductor structure further includes a CESL 118B between the ILD structure 120B and the spacers 116B and between the ILD structure 120B and the fin structure 106B. In some embodiments, a protective cap 119B is disposed on the ILD structure 120B.

As shown in FIG. 2B, the barrier layer 124B is a continuous barrier layer between the gate dielectric layer 122B and the work function metal layer 126B. In some embodiments, the barrier layer 124B includes a titanium-based material, a tantalum-based material, or a combination thereof, but the disclosure is not limited thereto. In some embodiments, the barrier layer 124B includes titanium nitride, tantalum nitride, or a combination thereof. In some embodiments, the barrier layer 124B has a thickness $T_B$.

FIG. 1C is a schematic cross-sectional view of a portion 100C of a semiconductor structure in accordance with some embodiments of the present disclosure. FIG. 2C is a magnified cross-sectional view of a region 200C of the portion 100C of the semiconductor structure illustrated in FIG. 1C. Referring to FIG. 1C, the portion 100C of the semiconductor structure includes a gate structure 130C over a fin structure 106C. The gate structure 130C includes a gate dielectric layer 122C over the fin structure 106C, a barrier structure 124C over the gate dielectric layer 122C, a work function metal layer 126C over the barrier structure 124C, and a gap-filling metal layer 128C over the work function metal layer 126C. The portion 100C of the semiconductor structure may also include spacers 116C over sidewalls of the gate structure 130C, and the gate dielectric layer 122C may also be disposed adjacent to the spacers 116C. The portion 100C of the semiconductor structure further includes an ILD structure 120C surrounding the gate structure 130C. In some embodiments, the portion 100C of the semiconductor structure further includes a CESL 118C between the ILD structure 120C and the spacers 116C and between the ILD structure 120C and the fin structure 106C. In some embodiments, a protective cap 119C is disposed on the ILD structure 120C.

As shown in FIG. 2C, the barrier structure 124C may be a grainy structure that includes a plurality of barrier granules 125. In some embodiments, the barrier structure 124 is discontinuous; for example, at least two adjacent barrier granules of the plurality of barrier granules 125 are separated from each other by a portion of the work function metal layer 126C as depicted in FIG. 2C. In some embodiments, at least a portion of the plurality of barrier granules 125 contacts one another. In some embodiments, the barrier structure 124C including the plurality of barrier granules 125 has a wavy interface with the work function metal layer 126C. In some embodiments, the plurality of barrier granules 125 include a tungsten-based material, a molybdenum-based material, a tantalum-based material, a titanium-based material, or a combination thereof. In some embodiments, the plurality of barrier granules include tungsten nitride, tungsten carbide, tungsten carbonitride, tungsten oxynitride, tungsten oxycarbide, tungsten oxycarbonitride, or a combination thereof, but the disclosure is not limited thereto. In some embodiments, the plurality of barrier granules 125 have a granule size of around 0.1 nm to around 10 nm, but the disclosure is not limited thereto. In some embodiments, the barrier structure 124C has a thickness $T_c$ of between around 0.1 nm and around 5 nm, but the disclosure is not limited thereto. The shape of the plurality of barrier granules 125 is not particularly limited. In some embodiments, the plurality of barrier granules 125 may be in shape of spheres, ovals, discs, polyhedra, or a combination thereof, but the disclosure is not limited thereto.

In some embodiments, the work function metal layers 126A, 126B and 126C include an n-type work function metal layer. In some embodiments, the work function metal layers 126A, 126B and 126C include aluminum (Al). In some embodiments, the gate dielectric layers 122A, 122B and 122C include a high-k dielectric material.

Referring to FIGS. 2A, 2B and 2C, the gate structure 130A is free of any barrier layer or barrier structure between the work function metal layer 126A and the gate dielectric layer 122A; the gate structure 130B includes a continuous barrier layer 124B between the work function metal layer 126B and the gate dielectric layer 122B; the gate structure 130C includes a barrier structure 124C including a plurality of barrier granules 125 between the work function metal layer 126C and the gate dielectric layer 122C. In some embodiments, a metal, such as Al, in the work function metal layers 126A, 126B and 126C may diffuse into the gate dielectric layers 122A, 122B and 122C, respectively, thereby influencing Vt of an electronic device, such as a transistor, thus formed. When a larger amount of the metal diffuses from the work function metal layers 126A, 126B and 126C into the gate dielectric layer 106A, 106B and 106C, Vt may become lower. In some embodiments, the continuous barrier layer 124B and the barrier structure 124C including the plurality of barrier granules 125 have metal diffusion barrier abilities to shield the gate dielectric layers 106B and 106C, respectively, from the metal diffusion. As a result, the amount of the metal diffusing into the gate dielectric layers 106B and 106C may be decreased as compared to that diffusing into the gate dielectric layer 106A which does not has any barrier layer or barrier structure thereon. Consequently, a semiconductor device including the gate structure 130B or 103C has a higher Vt than that including the gate structure 103A. In some embodiments, the barrier structure 124C including the plurality of barrier granules 125 has a better metal diffusion barrier ability than the continuous barrier layer 124B, thereby leading to an even higher Vt. Due to the better metal diffusion barrier ability imparted by the barrier granules 125, the barrier structure 124C can achieve a desired Vt even with an ultra-small thickness (for example, less than around 1.5 nm). Consequently, in some embodiments, the barrier structure 124C including the plurality of barrier granules 125 has a thickness $T_c$ less than a thickness $T_B$ of the continuous barrier layer 124B as depicted in FIGS. 2B and 2C. The barrier structure 124C hence has less impact on gap filling in a gate structure and is suitable for use in a gate structure having a small gate length (Lg), thereby facilitating the scaling in advanced technology nodes.

In some embodiments, the present disclosure provides a semiconductor structure including the portion 100C of the semiconductor structure shown in FIG. 1C and the portion 100A of the semiconductor structure shown in FIG. 1A. That is, in some embodiments, the present disclosure provides a semiconductor structure including the gate structure 130C and the gate structure 130A. The gate structure 130C includes a gate dielectric layer 122C, a work function metal layer 126C over the gate dielectric layer 122C, and a plurality of barrier granules 125 between the gate dielectric layer 122C and the work function metal layer 126C. The gate structure 130A includes a gate dielectric layer 122A, and a work function metal layer 126A over the gate dielectric layer 122A. The gate structure 130A is free of barrier granules. In some embodiments, the gate dielectric layer 122C and the gate dielectric layer 122A includes a same dielectric material. In some embodiments, the work function metal layer 126C and the work function metal layer 126A includes a same work function metal material. In some embodiments, the gate dielectric layer 122C and the gate dielectric layer 122A contains a same metal dopant, such as Al, diffusing from the work function metal layer 126C and the work function metal layer 126A, respectively. The gate dielectric layer 122C has a first metal content of the metal dopant, and the gate dielectric layer 122A has a second metal content of the metal dopant. The first metal content is less than the second metal content. In some embodiments, the semiconductor structure includes a fin structure 122C, and the gate structure 130C is disposed over the fin structure 122C. In some embodiments, the semiconductor structure includes a fin structure 106A, and the gate structure 130A is disposed over the fin structure 106A. In some embodiments, the semiconductor structure includes a first semiconductor device including the gate structure 130C, and a second semiconductor device including the gate structure 130A. In some embodiments, the first semiconductor device has a higher threshold voltage (Vt) than the second semiconductor device. The first semiconductor device thus may be referred to as a high voltage (HV) device, while the second semiconductor device may be referred to as a low voltage (LV) device.

In some embodiments, the present disclosure provides a semiconductor structure including the portion 100C of the semiconductor structure shown in FIG. 1C, the portion 100B of the semiconductor structure shown in FIG. 1B, and the portion 100A of the semiconductor structure shown in FIG. 1A. That is, in some embodiments, the present disclosure provides a semiconductor structure including the gate structure 130C, the gate structure 130B, and the gate structure 130A. In some embodiments, the gate dielectric layers 122C, 122B and 122A include a same dielectric material. In some embodiments, the work function metal layers 126C, 126B and 126A include a same work function metal material. In some embodiments, the gate dielectric layers 122C, 122B and 122A contain a same metal dopant, such as Al, diffusing from the work function metal layers 126C, 126B and 126A, respectively. In some embodiments, the gate dielectric layer 122C has a first metal content of the metal dopant, the gate dielectric layer 122B has a second metal content of the metal dopant, and the gate dielectric layer 122A has a third metal content of the metal dopant. The first metal content is less than the second metal content, and the second metal content is less than the third metal content. In some embodiments, the semiconductor structure includes a first semiconductor device including the gate structure 130C, a second semiconductor device including the gate structure 130B, and a third semiconductor device including the gate structure 130A. In some embodiments, the first semiconductor device has a higher threshold voltage than the second semiconductor device, and the second semiconductor device has a higher threshold voltage than the third semiconductor device. The first semiconductor device thus may be referred to as a high voltage (HV) device, while the second semiconductor device may be referred to as a middle voltage (MV) device, and the third semiconductor device may be referred to as a low voltage (LV) device.

Figure 3:
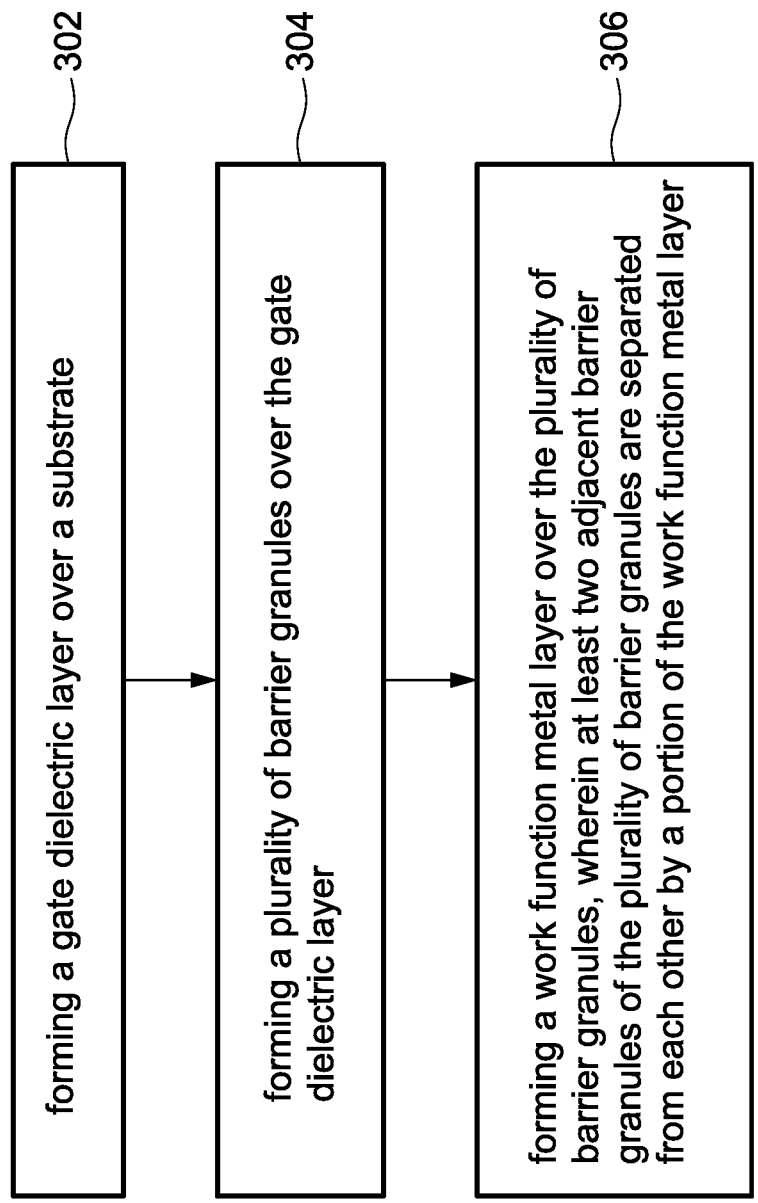
FIG. 3 is a flowchart showing a method for forming a semiconductor structure in accordance with some embodiments of the present disclosure.

FIG. 3 is a flowchart showing a method 30 for forming a semiconductor structure in accordance with some embodiments of the present disclosure. The method 30 includes an operation 302, in which a gate dielectric layer is formed over a substrate. The method 30 further includes an operation 304, in which a plurality of barrier granules are formed over the gate dielectric layer. In some embodiments, the operation 304 includes depositing a barrier material over the gate dielectric layer, and subjecting the barrier material to a thermal annealing treatment or a plasma treatment in an ambient including inert gas, $NH_3$, $N_2$, $H_2$, $O_2$, or a combination thereof. In some embodiments, the operation 304 includes depositing a barrier material over the gate dielectric layer, and reducing a thickness of the barrier material. The method 30 further includes an operation 306, in which a work function metal layer is formed over the plurality of barrier granules. In some embodiments, at least two adjacent barrier granules of the plurality of barrier granules are separated from each other by a portion of the work function metal layer.

Although this method and/or other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 4:
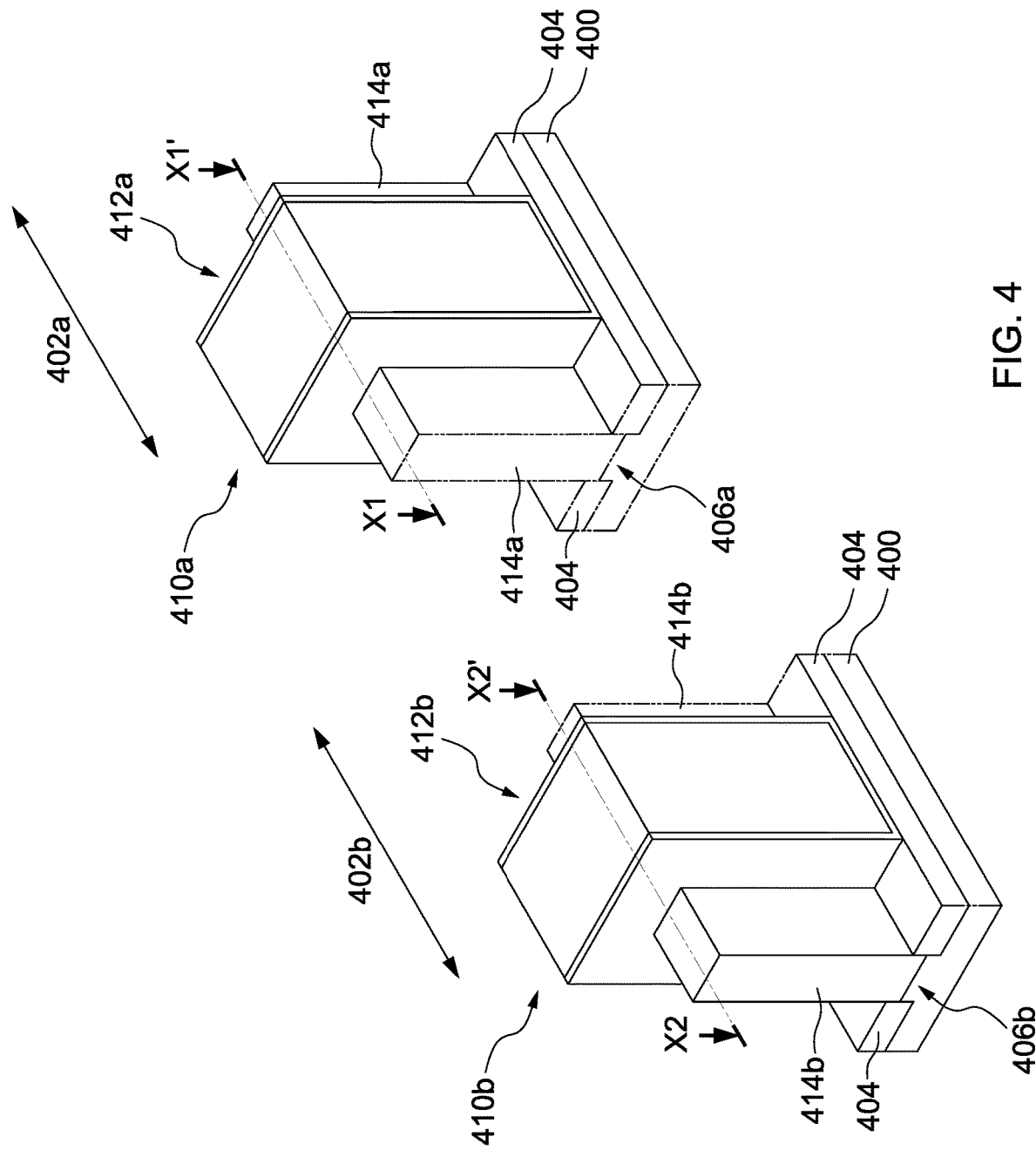
FIG. 4 shows schematic perspective views illustrating portions of a semiconductor structure at a fabrication stage in accordance with some embodiments of the present disclosure.

FIG. 4 shows perspective views illustrating portions of a semiconductor structure at a fabrication stage in accordance with some embodiments of the present disclosure. A first FET device 410a and a second FET device 410b are formed over a substrate 400. In some embodiments, the substrate 400 may be a semiconductor substrate such as a silicon substrate. The substrate 400 may also include other semiconductors such as germanium (Ge), silicon carbide (SiC), silicon germanium (SiGe), or diamond. Alternatively, the substrate 400 may include a compound semiconductor and/or an alloy semiconductor. The substrate 400 may include various layers, including conductive or insulating layers formed on a semiconductor substrate. The substrate 400 may include various doping configurations depending on design rules, as is known in the art. For example, different doping profiles (e.g., n wells or p wells) may be formed on the substrate 400 in regions designed for different device types (e.g., n-type field-effect transistors (NFET), or p-type field-effect transistors (PFET)). The suitable doping may include ion implantation of dopants and/or diffusion processes.

In some embodiments, the substrate 400 may include a first region 402a and a second region 402b. Further, the substrate 400 may include isolation structures, e.g., shallow trench isolation (STI) structures 404 interposing the first and second regions 402a and 402b. The first and second regions 402a and 402b are formed for accommodating different devices. For example, the first region 402a may accommodate a high voltage (HV) device while the second region 402b may accommodate a low voltage (LV) device. In some embodiments, the HV device used herein is a device having an operating voltage greater than that of the LV device. However, operating voltages can vary for different applications, and thus they are not limited herein.

In some embodiments, the devices 410a and 410b may be planar transistors or multi-gate transistors, such as FinFETs.

In some embodiments, the first FET device 410a is formed in the first region 402a. In some embodiments, the first FET device 410a may be an HV device. In some embodiments, the first FET device 410a may an n-type HV device, but the disclosure is not limited thereto. The first FET device 410a may include a first gate structure 412a and a first source/drain 414a. In some embodiments, the first FET device 410a may be a first FinFET device, and a first fin structure 406a is disposed over the substrate 400, as shown in FIG. 4. A portion of the first fin structure 406a covered by the first gate structure 412a serves as a channel region, and portions of the first fin structure 406a exposed through the first gate structure 412a serve as the first source/drain 414a.

In some embodiments, the second FET device 410b is formed in the second region 402b. In some embodiments, the second FET device 410b may be an LV device. In some embodiments, the second FET device 410a may be an n-type LV device, but the disclosure is not limited thereto. The second FET device 410b may include a second gate structure 412b and a second source/drain 414b. In some embodiments, the second FET device 410b is a second FinFET device, and a second fin structure 406b is disposed over the substrate 400, as shown in FIG. 4. Similar to the first FET device 410a described above, in the second FET device 410b, a portion of the second fin structure 406b covered by the second gate structure 412b serves as a channel region, and portions of the second fin structure 406b exposed through the second gate structure 412b serve as the second source/drain 414b.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 5 to 12 show schematic cross-sectional views of a semiconductor structure taken along lines X1-X1' and X2-X2' at various fabrication stages in accordance with some embodiments of the present disclosure. In some embodiments, the first gate structure 412a and the second gate structure 412b are sacrificial gate structures. The first and second sacrificial gate structures 412a and 412b may respectively include a dielectric layer and a sacrificial semiconductor layer over the dielectric layer. In some embodiments, the sacrificial semiconductor layers are made of polysilicon, but the disclosure is not limited thereto. In some embodiments, spacers 416 (shown in FIG. 5) may be formed over sidewalls of the sacrificial gate structures 412a, 412b. In some embodiments, the spacers 416 are made of silicon nitride (SiN), silicon carbide (SiC), silicon oxide (SiO$_x$), silicon oxynitride (SiON), silicon oxycarbide or any other suitable material, but the disclosure is not limited thereto. In some embodiments, the spacers 416 are formed by deposition and etch back operations.

As shown in FIG. 4, in some embodiments, the first source/drain 414a is formed over the first fin structure 406a at two opposite sides of the first gate structure 412a. Similarly, the second source/drain 414b is formed over the second fin structure 406b at two opposite sides of the second gate structure 412b. In some embodiments, heights of the first source/drain 414a and the second source/drain 414b may be greater than heights of the first and second fin structures 406a and 406b. In some embodiments, the first and second source/drain 414a and 414b may be formed by forming recesses in the fin structures 406a and 406b and growing a strained material in the recesses by an epitaxial (epi) process. In addition, the lattice constant of the strained material may be different from the lattice constant of the fin structures 406a and 406b. Accordingly, the first and second source/drain 414a and 414b may serve as stressors that improve carrier mobility. In some embodiments, the first source/drain 414a and the second source/drain 414b may both include n-type dopants. However, a dopant concentration of the first source/drain 414a may be different from that of the second source/drain 414b.

Figure 5:
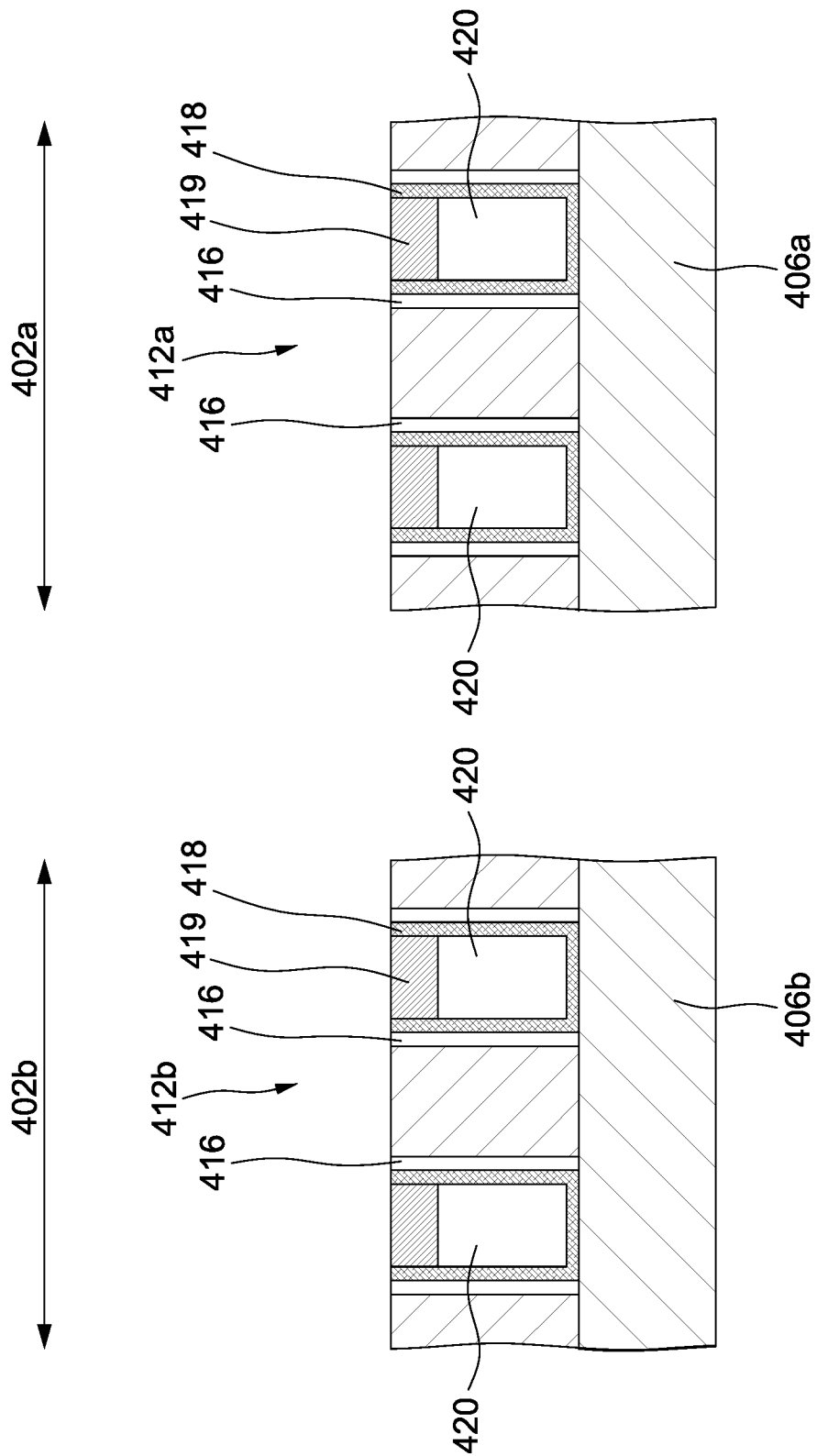
FIGS. 5 to 12 show schematic cross-sectional views of a semiconductor structure taken along lines X1-X1' and X2-X2' at various fabrication stages in accordance with some embodiments of the present disclosure.

In some embodiments, after the forming of the source/drain structures, a contact etch stop layer (CESL) 418 may be formed to cover the first and second gate structures 412a and 412b over the substrate 400. In some embodiments, the CESL 418 may include silicon nitride, silicon oxynitride, and/or other applicable materials. Subsequently, an interlayer dielectric (ILD) structure 420 may be formed on the CESL 418 in accordance with some embodiments. The ILD structure 420 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon-doped silicon oxide, amorphous fluorinated carbon, parylene, bisbenzocyclobutenes (BCB), or polyimide. Next, a polishing process is performed on the ILD structure 420 and the CESL 418 to expose top surfaces of the first and second gate structures 412a and 412b, as shown in FIG. 5. In some embodiments, the ILD structure 420 and the CESL 418 are planarized by a chemical mechanical polishing (CMP) process until the top surfaces of the first and second gate structures 412a and 412b are exposed. Consequently, the structure 420 surrounds the first and second gate structures 412a, 412b and the first and second fin structures 406a, 406b. In other words, the fin structures 406a, 406b and the sacrificial gate structures 412a, 412b are embedded in the ILD structure 420, while a top surface of the sacrificial gate structures 412a, 412b remains exposed, as shown in FIG. 5. Additionally, in some embodiments, a protective cap 419 may be formed over the ILD structure 420 by, for example, recessing the ILD structure 420, depositing a protective material and polishing, but the disclosure is not limited thereto. Examples of the protective material include, but are not limited to, silicon nitrides.

Figure 6:
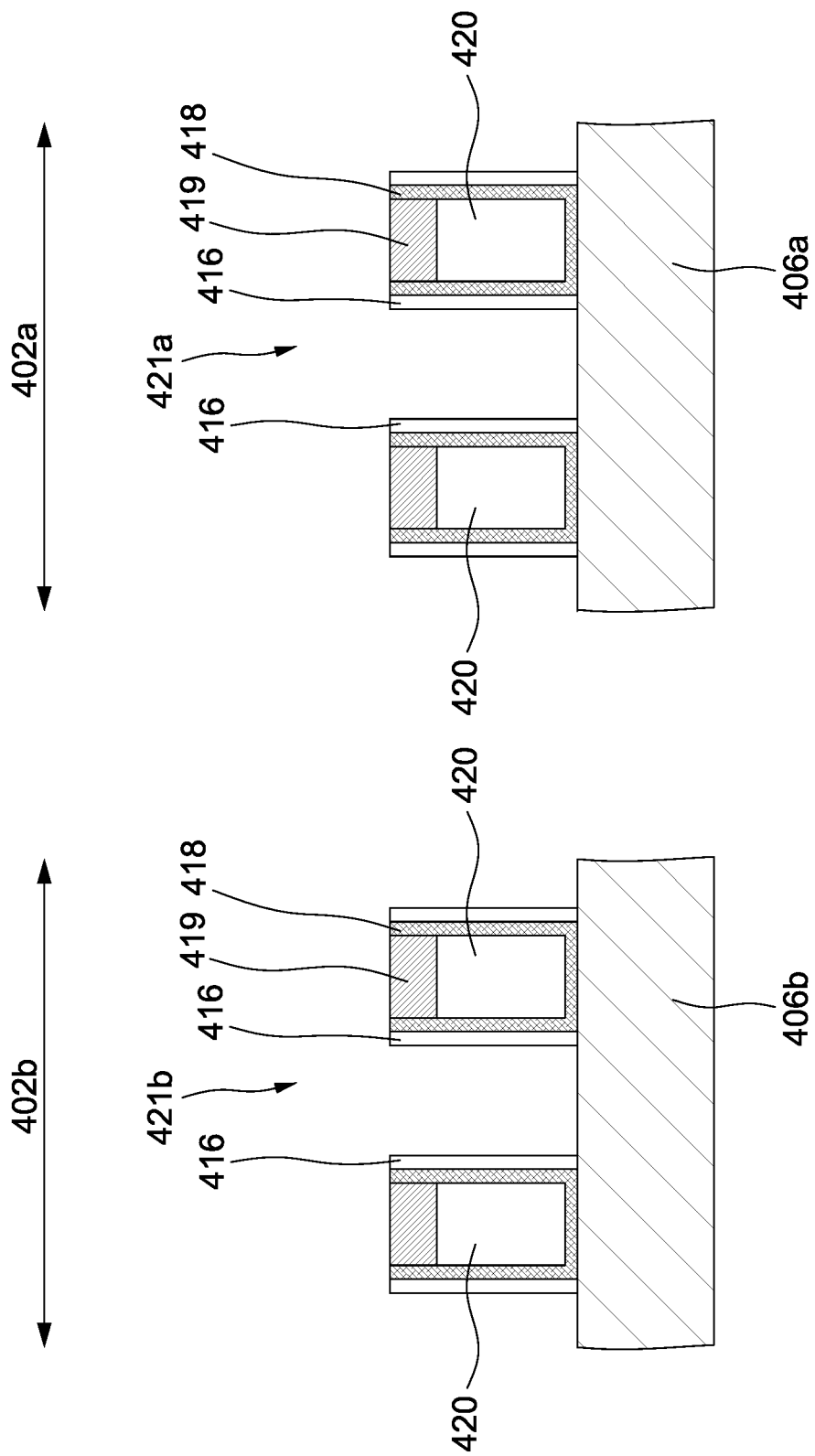

Referring to FIG. 6, in some embodiments, a first gate trench 421a is formed in the first region 402a and a second gate trench 421b is formed in the second region 402b. In some embodiments, the sacrificial semiconductor layer is removed. In some embodiments, the protective cap 419 protects the ILD structure 420 during the removal of the sacrificial semiconductor layer. In some embodiments, the dielectric layer may be removed for forming an interfacial layer (IL). In some embodiments, the dielectric layer may be left in the gate trench, though not shown. It should be noted that the removal of the dielectric layer may be performed depending on different process or product specifications. Accordingly, the first fin structure 406a is exposed through the first gate trench 421a, and the second fin structure 406b is exposed through the second gate trench 421b, as shown in FIG. 6. In some embodiments, the first gate trench 421a and the second gate trench 421b have a gate length of between approximately 10 nm and approximately 30 nm, but the disclosure is not limited thereto.

Figure 7:
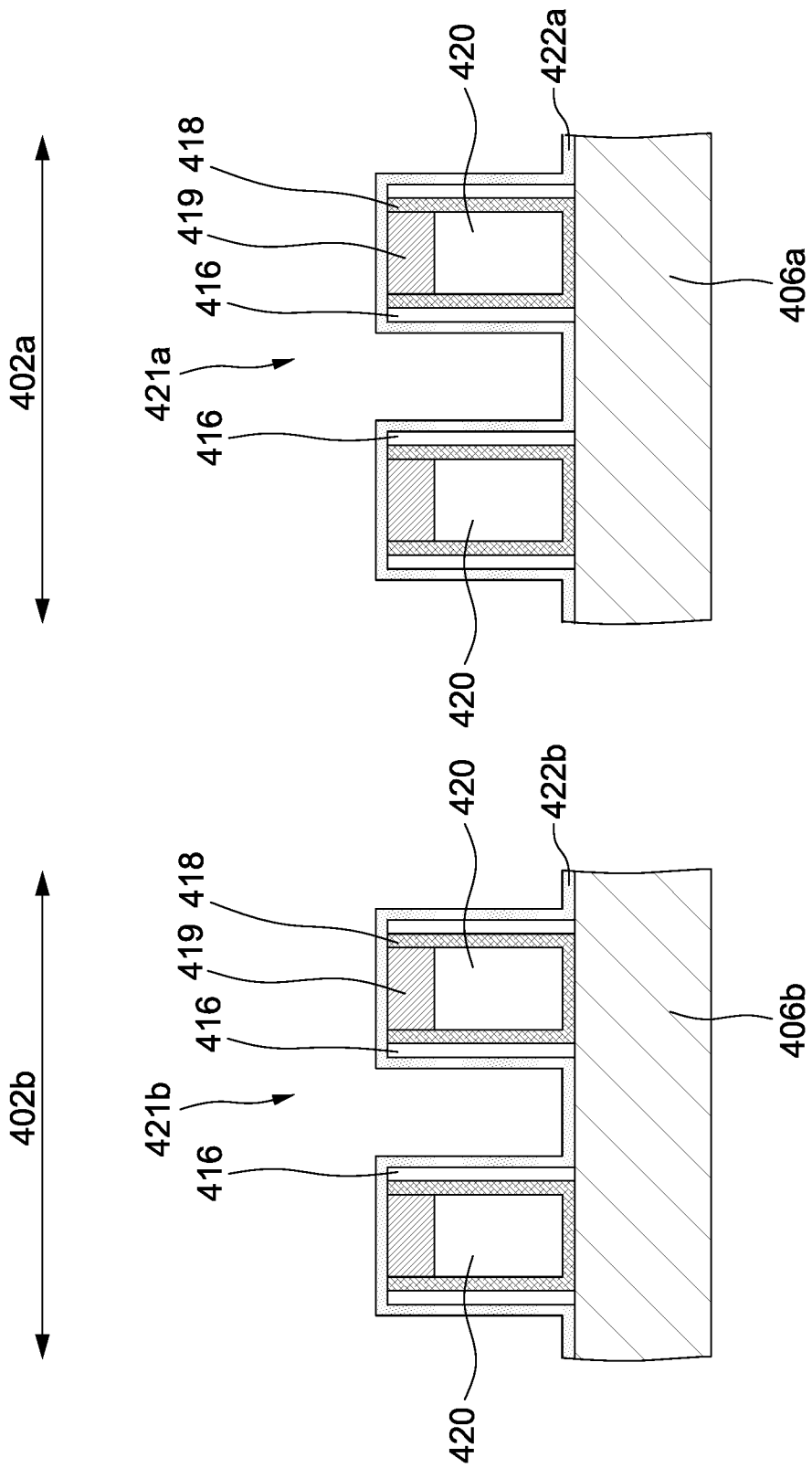

Referring to FIG. 7, in some embodiments, a first gate dielectric layer 422a is formed in the first gate trench 421a, and a second gate dielectric layer 422b is formed in the second gate trench 421b. In some embodiments, an IL layer may be formed prior to the forming of the first and second gate dielectric layers 422a and 422b, though not shown. The IL layer may include an oxide-containing material such as SiO$_x$ or SiON. In some embodiments, the IL layer covers portions of the fin structures 406a, 406b exposed in the gate trenches 421a, 421b. The first and second gate dielectric layers 422a and 422b may be simultaneously formed on the IL layer. In some embodiments, the first and second gate dielectric layers 422a and 422b may be conformally formed in the gate trenches 421a and 421b. Accordingly, the first gate dielectric layer 422a covers at least sidewalls of the first gate trench 421a, and the second gate dielectric layer 422b covers at least sidewalls of the second gate trench 421b. In some embodiments, the first and second gate dielectric layers 422a and 422b include a high-k dielectric material having a high dielectric constant, for example, greater than that of thermal silicon oxide (around 3.9). The high-k dielectric material may include hafnium oxide (HfO$_2$), zirconium oxide (ZrO$_2$), lanthanum oxide (La$_2$O$_3$), aluminum oxide (Al$_2$O$_3$), titanium oxide (TiO$_2$), yttrium oxide (Y$_2$O$_3$), strontium titanate (SrTiO$_3$), hafnium oxynitride (HfOxNy), other suitable metal-oxides, or combinations thereof.

Figure 8:
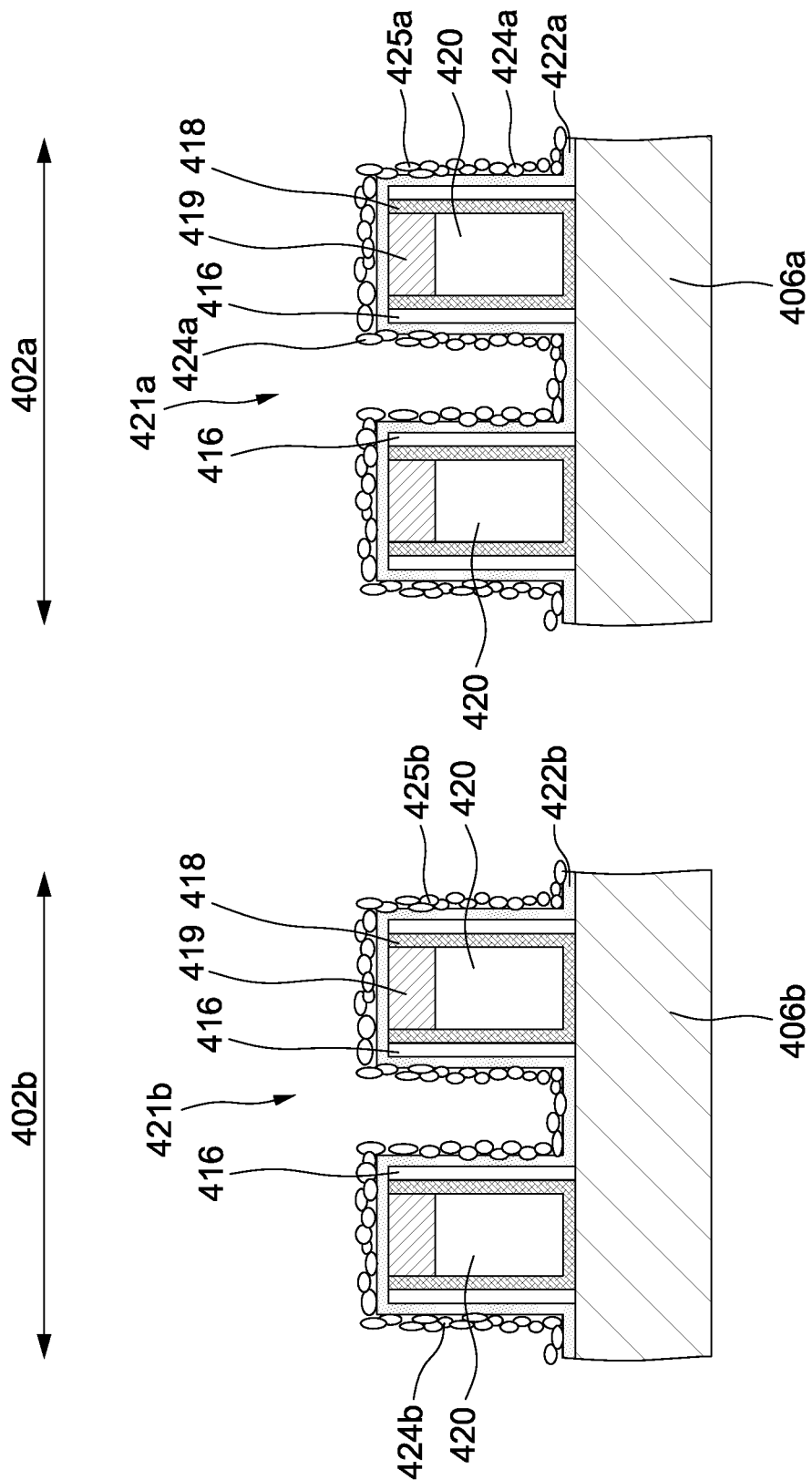

Referring to FIG. 8, in some embodiments, a first barrier structure 424a including a plurality of first barrier granules 425a is formed over the first gate dielectric layer 422a, and a second barrier structure 424b including a plurality of second barrier granules 425b is formed over the second gate dielectric layer 422b. In some embodiments, the first and second barrier structures 424a and 424b are formed simultaneously. In some embodiments, the first and second barrier structures 424a and 424b may be formed along the first and second gate trenches 421a and 421b, respectively. In some embodiments, the first and second barrier structures 424a and 424b may be formed and adjusted by tuning process temperatures, film thicknesses, film compositions, or a combination thereof, but the disclosure is not limited thereto. For example, the first and second barrier structures 424a and 424b may be formed by atomic layer deposition (ALD) or chemical vapor deposition (CVD) at a temperature in a range of between around 100° C. and around 600° C. and at a pressure in a range of between around 0.1 torr and around 100 torr. In some embodiments, the first and second barriers granules 425a and 425b are formed during a deposition process. In some embodiments, the first and second barriers granules 425a and 425b may be further adjusted by a post-deposition treatment. Examples of the post-deposition treatments include, but are not limited to, a thermal annealing treatment or a plasma treatment in an ambient including inert gas, NH$_3$, N$_2$, H$_2$, O$_2$, or a combination thereof. The thermal treatment may be conducted at a temperature in a range of between around 100° C. and around 1000° C. In alternative embodiments, the first and second barrier granules 425a and 425b are formed by depositing a layer (or film) of a barrier material over the first and second gate dielectric layers 422a and 422b, followed by reducing a thickness of the barrier material by, for example, dry or wet etching. In some embodiments, the first and second barrier structures 424a and 424b, respectively, are discontinuous; for example, at least two adjacent barrier granules of the first and second barrier granules 425a and 425b, respectively, are separated from each other by a space. In some embodiments, a thickness of the first barrier structure 424a and a thickness of the second barrier structure 424b are similar. In some embodiments, the thicknesses of the first and second barrier structures 424a and 424b may be between approximately 0.1 nm and approximately 10 nm, but the disclosure is not limited thereto. For example, the thicknesses of the first and second barrier structures 424a and 424b may be between 0.1 nm and approximately 5 nm, or less than approximately 1.5 nm. In some embodiments, the first and second barrier granules 425a and 425b have a granule size of between around 0.1 nm and 10 nm, but the disclosure is not limited thereto. Further, the first and second barrier granules 425a and 425b include a same material. In some embodiments, the first and second barrier granules 425a and 425b both include a tungsten-based material, a molybdenum-based material, a tantalum-based material, a titanium-based material, or a combination thereof, but the disclosure is not limited thereto. In some embodiments, the first and second barrier granules 425a and 425b both include tungsten (W). For example, the first and second barrier granules 425a and 425b may include W-based metal, such as WNx, WCx, WCxNy, W-based metal with oxygen, W-based metal without oxygen, or combinations thereof.

Figure 9:
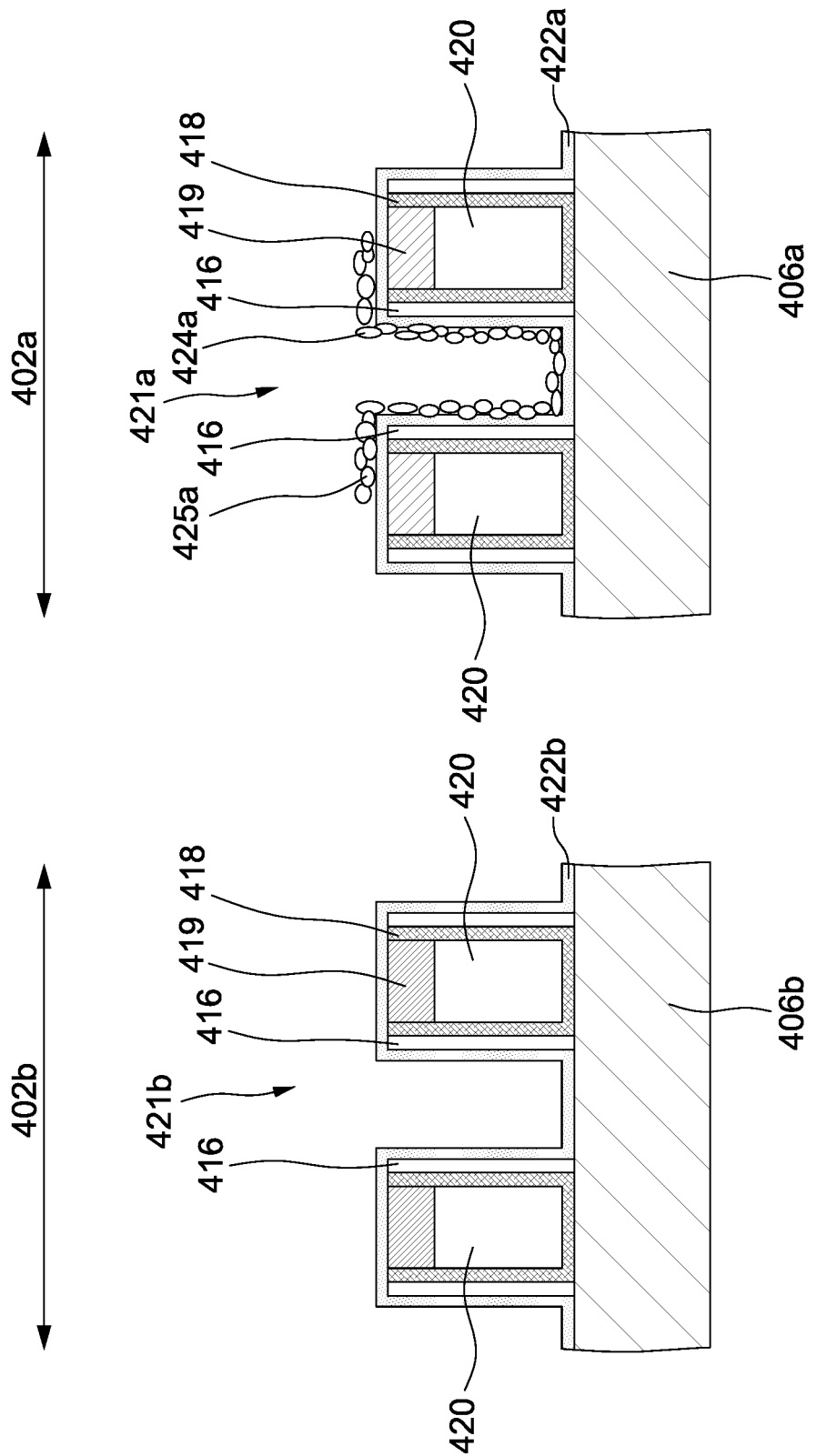

Referring to FIG. 9, in some embodiments, the second barrier structure 424b is removed to expose the second gate dielectric layer 422b in the second gate trench 421b. In some embodiments, a protecting layer or a masking layer may be formed in the first region 402a, and a suitable etching operation may be performed to remove the second barrier structure 424b. Thus, the second barrier structure 424b is removed from the second region 402b, while the first barrier structure 424a is remained in the first region 402a. The protecting layer or the masking layer is removed after the removal of the second barrier structure 424b.

Figure 10:
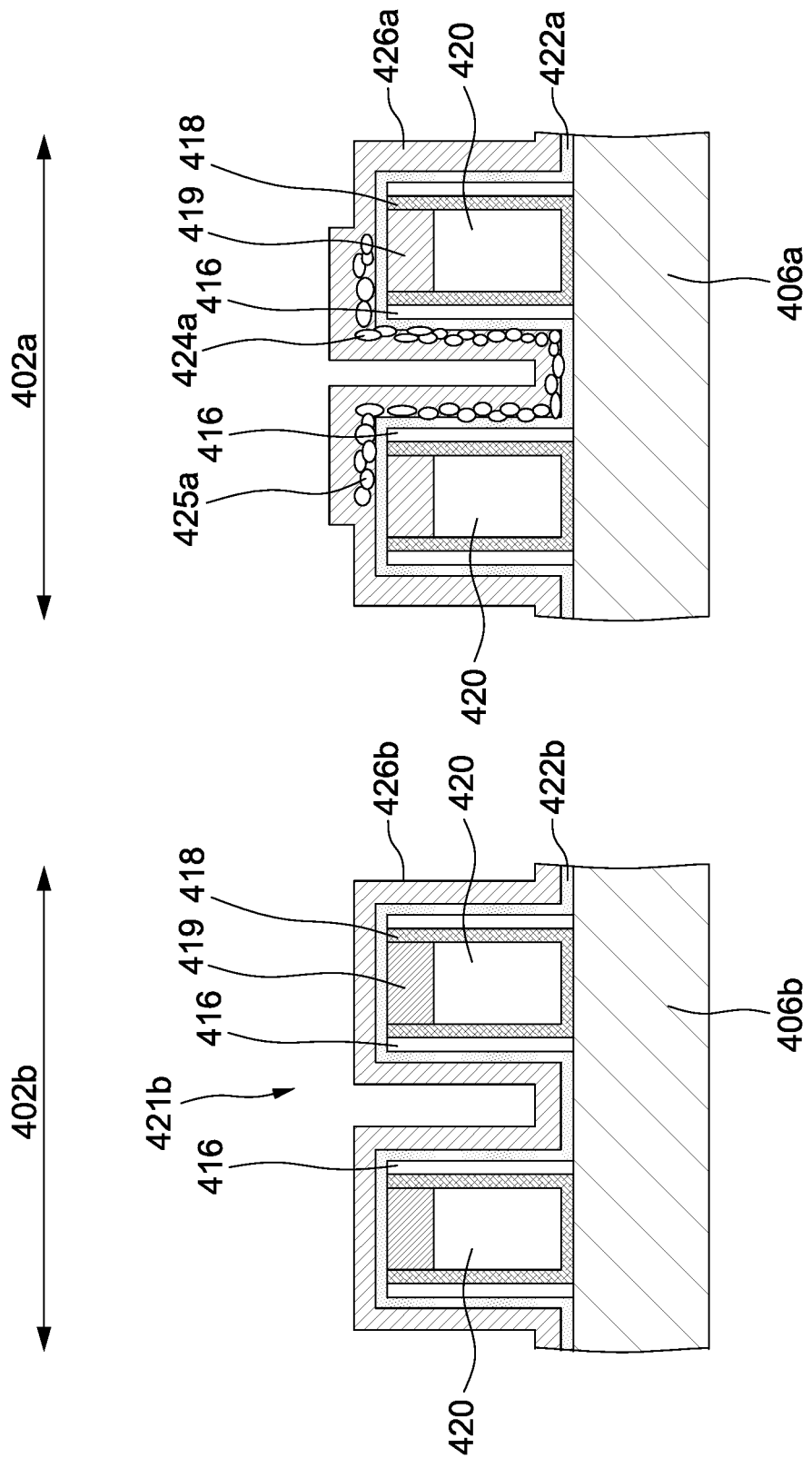

Referring to FIG. 10, in some embodiments, a first work function metal layer 426a is formed over the first barrier structure 424a, and a second work function metal layer 426b is formed over the second gate dielectric layer 422b. In some embodiments, the first work function metal layer 426a may be in direct contact with the first barrier layer 424a, while the second work function metal layer 426b may be in direct contact with the second gate dielectric layer 422b. In some embodiments, since the first barrier structure 424a is not continuous, the first work function metal layer 426a may fill in a space between at least two adjacent barrier granules of the plurality of first barrier granules 425a. A thickness of the first work function metal layer 426a and a thickness of the second work function metal layer 426b may be similar. The first work function metal layer 426a and the second work function metal layer 426b may both be n-type work function metal layers. Further, the first and second work function metal layers 426a and 426b may include same n-type metal materials. In some embodiments, the first work function metal layer 426a and the second work function metal layer 426b may both be n-type work function metal layers including aluminum (Al). In some embodiments, the first and second work function metal layers 426a and 426b may be single-layered structures or multilayers of two or more materials, but the disclosure is not limited thereto. In some embodiments, an Al-containing n-type metal layer may be the layer closest to the first barrier layer 424a and the second gate dielectric layer 422b.

Figure 11:
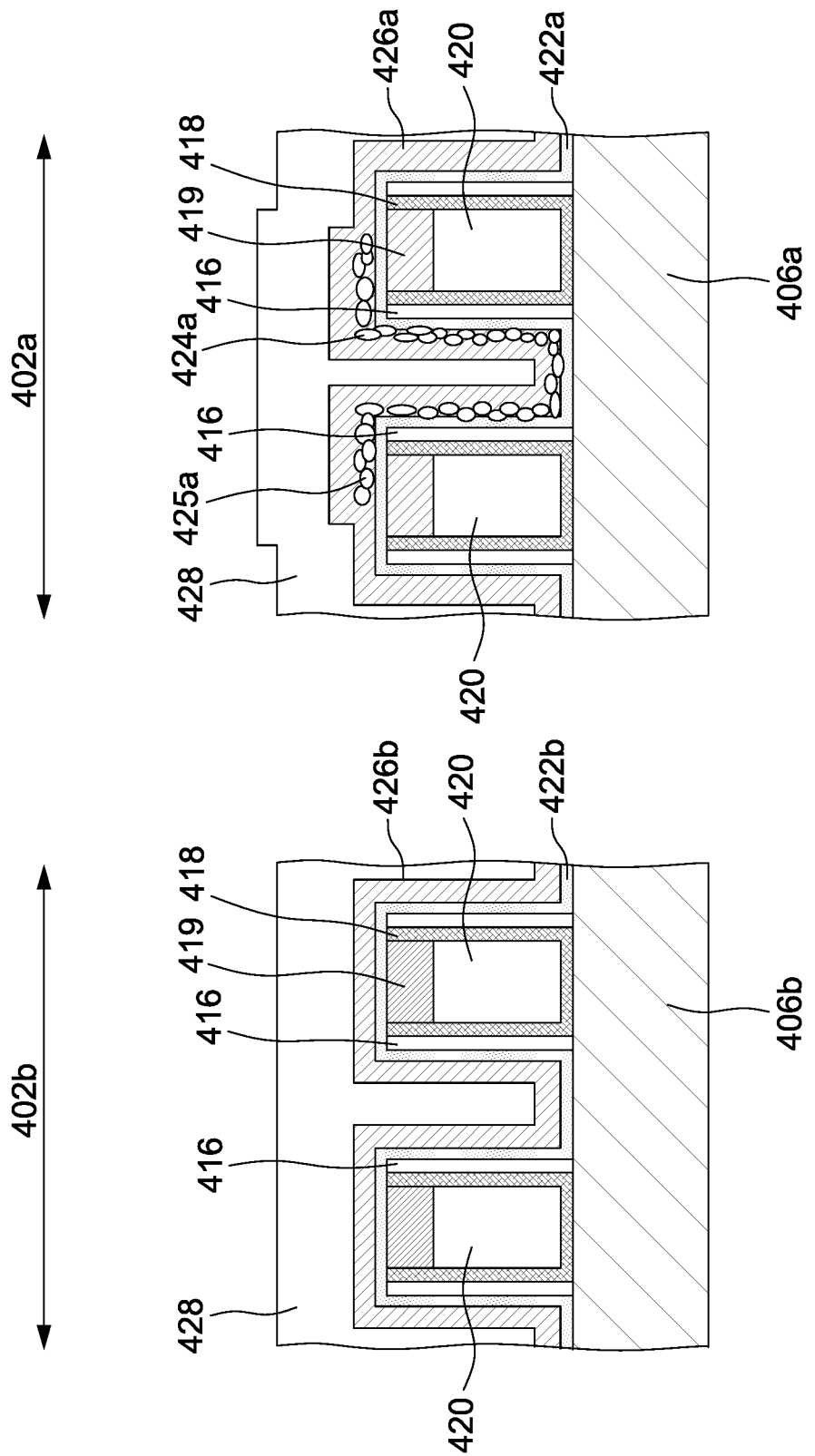

Referring to FIG. 11, in some embodiments, a gap-filling metal layer 428 is formed to fill the first gate trench 421a and the second gate trench 421b. In some embodiments, the gap-filling metal layer 428 may include conductive material such as Al, Cu, AlCu, or W, but the disclosure is not limited thereto.

Figure 12:
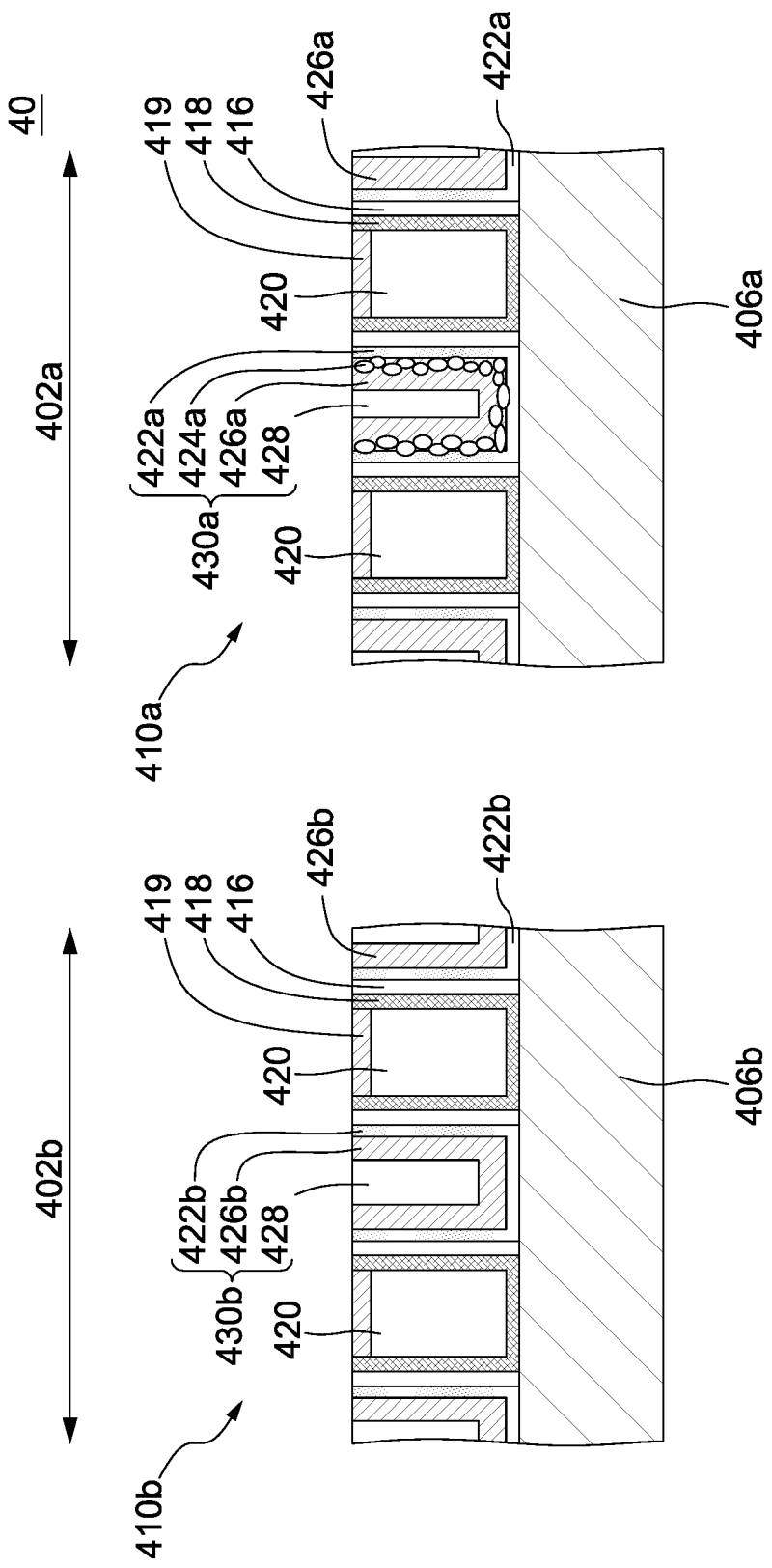

Referring to FIG. 12, in some embodiments, a planarization operation such as a CMP may be performed to remove superfluous layers. Accordingly, portions of the first and second gate dielectric layers 422a and 422b, portions of the first barrier structure 424a, portions of the first and second work function metal layers 426a and 426b, and portions of the gap-filling layer 428 are removed. Thus, a first metal gate structure 430a is formed in the first FET device 410a in the first region 402a, and a second metal gate structure 430b is formed in the second FET device 410b in the second region 402b. In some embodiments, a top surface of the first metal gate structure 430a, a top surface of the second metal gate structure 430b and top surfaces of the ILD structure 420 may be level with each other (i.e., the top surfaces may be co-planar).

Accordingly, a semiconductor structure 40 is obtained as shown in FIG. 12. The semiconductor structure 40 includes the first device 410a and the second FET device 410b. As mentioned above, the first FET device 410a and the second FET device 410b may both be FinFET devices. Therefore, the first FET device 410a includes the first metal gate structure 430a over the first fin structure 406a, and the second FET device 410b includes the second metal gate structure 430b over the second fin structure 406b. The first metal gate structure 430a includes the first gate dielectric layer 422a, the first work function metal layer 426a over the first gate dielectric layer 422a, and the first barrier structure 424a between the first work function metal layer 426a and the first gate dielectric layer 422a. The first barrier structure 424a includes a plurality of barrier granules 425a. The second metal gate structure 430b includes the second gate dielectric layer 422b and the second work function metal layer 426b over the second gate dielectric layer 422b. As mentioned above, the first and second work function metal layers 426a and 426b may be n-type work function metal layers. Further, the first and second work function metal layers 426a and 426b may be Al-containing n-type work function metal layers. Moreover, the first and second gate dielectric layers 422a and 422b may include a high-k dielectric material.

The present disclosure provides a semiconductor structure and a method for forming the semiconductor structure in accordance with some embodiments. The semiconductor structure includes a gate structure including a barrier structure between a work function metal layer and a gate dielectric layer. In some embodiments, the barrier structure includes a plurality of barrier granules. The barrier granules provide the barrier structure with a greater metal barrier ability than that free of barrier granules. With the barrier granules, a great metal barrier ability can be achieved for Vt modulation even by an ultra-thin barrier structure (e.g., 0.1 nm to 5 nm). The ultra-thin barrier structure has less impact on gap filling in the gate structure and is suitable for use in a gate structure having a small gate length (Lg), thereby facilitating scaling in advanced technology nodes.

In some embodiments, a semiconductor structure is provided. The semiconductor structure includes a gate structure. The gate structure includes a gate dielectric layer; a work function metal layer over the gate dielectric layer; and a plurality of barrier granules between the gate dielectric layer and the work function metal layer. At least two adjacent barrier granules of the plurality of barrier granules are separated from each other by a portion of the work function metal layer in some embodiments.

In some embodiments, a semiconductor structure is provided. The semiconductor structure includes a first gate structure and a second gate structure. The first gate structure includes a first gate dielectric layer; a first work function metal layer over the first gate dielectric layer; and a plurality of barrier granules between the first gate dielectric layer and the first work function metal layer. The second gate structure includes a second gate dielectric layer; and a second work function metal layer over the second gate dielectric layer. The first gate dielectric layer and the second gate dielectric layer contain a same metal dopant. The first gate dielectric layer has a first metal content of the metal dopant, and the second gate dielectric layer has a second metal content of the metal dopant. The first metal content is less than the second metal content.

In some embodiments, a method for forming a semiconductor structure is provided. The method includes the following operations. A gate dielectric layer is formed over a substrate. A plurality of barrier granules are formed over the gate dielectric layer. A work function metal layer is formed over the plurality of barrier granules, wherein at least two adjacent barrier granules of the plurality of barrier granules are separated from each other by a portion of the work function metal layer in some embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a gate structure comprising:
        a gate dielectric layer;
        a work function metal layer over the gate dielectric layer; and
        a plurality of barrier granules between the gate dielectric layer and the work function metal layer,
    wherein at least two adjacent barrier granules of the plurality of barrier granules are separated from each other by a portion of the work function metal layer; and wherein a subset of the plurality of barrier granules contact both the gate dielectric layer and the work function metal layer, and are connected to form a section of non-uniform thicknesses.

2. The semiconductor structure of claim 1, wherein at least a portion of the plurality of barrier granules contact one another.

3. The semiconductor structure of claim 1, wherein the plurality of barrier granules comprise a tungsten-based material, a molybdenum-based material, a tantalum-based material, a titanium-based material, or a combination thereof.

4. The semiconductor structure of claim 3, wherein the plurality of barrier granules comprise tungsten nitride, tungsten carbide, tungsten carbonitride, tungsten oxynitride, tungsten oxycarbide, tungsten oxycarbonitride, or a combination thereof.

5. The semiconductor structure of claim 1, wherein the plurality of barrier granules have a granule size of around 0.1 nm to around 10 nm.

6. The semiconductor structure of claim 1, wherein the plurality of barrier granules form a barrier structure having a wavy interface with the work function metal layer.

7. The semiconductor structure of claim 6, wherein the barrier structure has a thickness of around 0.1 nm to around 5 nm.

8. The semiconductor structure of claim 1, wherein the work function metal layer comprises an n-type work function metal layer.

9. The semiconductor structure of claim 1, wherein the work function metal layer comprises aluminum (Al).

10. The semiconductor structure of claim 1, wherein the gate dielectric layer comprises a high-k dielectric material.

11. The semiconductor structure of claim 1, wherein the gate dielectric layer comprises a metal dopant the same as a metal in the work function metal layer.

12. A semiconductor structure, comprising:
    a first gate structure comprising:
        a first gate dielectric layer;
        a first work function metal layer over the first gate dielectric layer; and
        a plurality of barrier granules between the first gate dielectric layer and the first work function metal layer; and
    a second gate structure comprising:
        a second gate dielectric layer; and
        a second work function metal layer over the second gate dielectric layer,
        wherein the first gate dielectric layer and the second gate dielectric layer comprise a same metal dopant, the first gate dielectric layer has a first metal content of the metal dopant, the second gate dielectric layer has a second metal content of the metal dopant, and the first metal content is less than the second metal content.

13. The semiconductor structure of claim 12, further comprising a first semiconductor device comprising the first gate structure, and a second semiconductor device comprising the second gate structure, wherein the first semiconductor device has a higher threshold voltage than the second semiconductor device.

14. The semiconductor structure of claim 12, wherein the second gate structure is free of barrier granules.

15. The semiconductor structure of claim 12, wherein the second gate structure further comprises a continuous barrier layer between the second gate dielectric layer and the second work function metal layer.

16. The semiconductor structure of claim 15, wherein the continuous barrier layer comprises a titanium-based material, tantalum-based material, or a combination thereof.

17. The semiconductor structure of claim 12, wherein the plurality of barrier granules comprise tungsten nitride, tungsten carbide, tungsten carbonitride, tungsten oxynitride, tungsten oxycarbide, tungsten oxycarbonitride, or a combination thereof.

18. The semiconductor structure of claim 12, further comprising:
- a first fin structure, wherein the first gate structure is disposed over the first fin structure; and
- a second fin structure, wherein the second gate structure is disposed over the second fin structure.

19. A method for forming a semiconductor structure, comprising:
- forming a gate dielectric layer over a substrate;
- forming a plurality of barrier granules over the gate dielectric layer; and
- forming a work function metal layer over the plurality of barrier granules, wherein at least two adjacent barrier granules of the plurality of barrier granules are separated from each other by a portion of the work function metal layer,
- wherein forming the plurality of barrier granules over the gate dielectric layer comprises depositing a barrier material over the dielectric layer and reducing a thickness of the barrier material.

20. The method of claim 19, wherein forming the plurality of barrier granules over the gate dielectric layer comprises depositing a barrier material over the gate dielectric layer, and subjecting the barrier material to a thermal annealing treatment or a plasma treatment in an ambient comprising inert gas, $NH_3$, $N_2$, $H_2$, $O_2$, or a combination thereof.

* * * * *